(12) United States Patent
Kang et al.

(10) Patent No.: US 11,638,346 B2
(45) Date of Patent: Apr. 25, 2023

(54) COMPONENT PACKAGE AND PRINTED CIRCUIT BOARD FOR THE SAME

(71) Applicant: SAMSUNG ELECTRO-MECHANICS CO., LTD., Suwon-si (KR)

(72) Inventors: Seon Ha Kang, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/205,268

(22) Filed: Mar. 18, 2021

(65) Prior Publication Data

US 2022/0053631 A1    Feb. 17, 2022

(30) Foreign Application Priority Data

Aug. 11, 2020    (KR) ........................ 10-2020-0100436

(51) Int. Cl.
| | |
|---|---|
| *H05K 1/18* | (2006.01) |
| *H05K 1/02* | (2006.01) |
| *H05K 9/00* | (2006.01) |
| *H01L 25/065* | (2023.01) |
| *H01L 23/552* | (2006.01) |

(Continued)

(52) U.S. Cl.
CPC ....... *H05K 1/0218* (2013.01); *H01L 21/4853* (2013.01); *H01L 21/56* (2013.01); *H01L 23/49811* (2013.01); *H01L 23/552* (2013.01); *H01L 25/0655* (2013.01); *H05K 1/181* (2013.01); *H05K 3/108* (2013.01); *H05K 3/284* (2013.01); *H05K 9/0022* (2013.01); *H05K 3/16* (2013.01); *H05K 2201/0715* (2013.01); *H05K 2201/09972* (2013.01); *H05K 2201/1003* (2013.01); *H05K 2201/10015* (2013.01);

(Continued)

(58) Field of Classification Search
CPC .... H05K 1/02; H05K 1/14; H05K 1/141–144; H05K 1/18; H05K 1/181–187; H05K 9/00; H05K 9/02; H05K 3/42; H05K 3/421; H05K 3/30; H05K 3/301; H05K 123/31; H05K 123/552; H05K 123/065
USPC ......... 361/782–795, 816, 818; 257/660–730, 257/787–790; 174/520
See application file for complete search history.

(56) References Cited

U.S. PATENT DOCUMENTS

| | | | |
|---|---|---|---|
| 10,553,542 B2* | 2/2020 | Shin | ............... H01L 21/4853 |
| 2004/0252475 A1* | 12/2004 | Tsuneoka | ............ H01L 23/3121 |
| | | | 257/E23.125 |

(Continued)

FOREIGN PATENT DOCUMENTS

| | | |
|---|---|---|
| KR | 10-2008-0033069 A | 4/2008 |
| KR | 10-2010-0008252 A | 1/2010 |
| KR | 10-1332332 B1 | 11/2013 |

*Primary Examiner* — Tuan T Dinh
(74) *Attorney, Agent, or Firm* — Morgan, Lewis & Bockius LLP

(57) ABSTRACT

A component package includes a printed circuit board; a first electronic component disposed in a first region on the printed circuit board; a second electronic component disposed in a second region on the printed circuit board; and a metal wall disposed on the printed circuit board and spatially partitioning the first region and the second region on a plane. The metal wall is directly connected to the printed circuit board.

16 Claims, 12 Drawing Sheets

(51) Int. Cl.
    *H01L 23/498*     (2006.01)
    *H01L 21/48*     (2006.01)
    *H05K 3/10*     (2006.01)
    *H05K 3/28*     (2006.01)
    *H01L 21/56*     (2006.01)
    *H05K 3/16*     (2006.01)

(52) U.S. Cl.
    CPC ............... *H05K 2201/1056* (2013.01); *H05K 2203/0723* (2013.01); *H05K 2203/1469* (2013.01)

(56) References Cited

U.S. PATENT DOCUMENTS

| | | | |
|---|---|---|---|
| 2006/0274517 A1* | 12/2006 | Coffy | H01L 23/552 174/262 |
| 2008/0089048 A1 | 4/2008 | Yamano et al. | |
| 2010/0013094 A1 | 1/2010 | Jo et al. | |
| 2012/0320559 A1* | 12/2012 | Kimura | H01L 23/552 361/818 |
| 2015/0043171 A1* | 2/2015 | Mugiya | H05K 7/06 361/728 |
| 2015/0043189 A1* | 2/2015 | Kitazaki | H05K 3/244 29/832 |
| 2015/0049439 A1* | 2/2015 | Shimamura | H01L 24/97 361/728 |
| 2015/0070851 A1* | 3/2015 | Kitazaki | H05K 3/301 29/841 |
| 2017/0243833 A1* | 8/2017 | Choi | H01L 21/565 |
| 2019/0096791 A1* | 3/2019 | Jeng | H01L 21/56 |
| 2019/0393162 A1* | 12/2019 | Jun | H01L 25/50 |
| 2020/0137893 A1* | 4/2020 | Nomura | H01L 25/18 |

* cited by examiner

COMPONENT PACKAGE AND PRINTED CIRCUIT BOARD FOR THE SAME

CROSS-REFERENCE TO RELATED APPLICATION(S)

This application claims benefit of priority to Korean Patent Application No. 10-2020-0100436 filed on Aug. 11, 2020 in the Korean Intellectual Property Office, the disclosure of which is incorporated herein by reference in its entirety.

TECHNICAL FIELD

The present disclosure relates to a component package and a printed circuit board used for the same.

BACKGROUND

To correspond to display devices of which sizes have been increased, a thickness and a size of a battery have also been increased, and a component mounting region of a main board has been continuously limited. In particular, as the number of radio frequency (RF) modules has been increased as 5G has been employed, the importance of miniaturization has increased. Accordingly, it may be considered to reduce the increasing number of modules through integrated modularization of adjacent bands. Even with such an integrated modularization, however, as basic functional losses should be prevented, interference noise between frequencies should be reduced.

SUMMARY

An aspect of the present disclosure is to provide a component package which may have a reduced size through modularization and a printed circuit board used for the same.

Another aspect of the present disclosure is to provide a component package which may have an improved electromagnetic shielding function and a printed circuit board used for the same.

According to an aspect of the present disclosure, a metal wall which may be disposed between a plurality of electronic components and which may perform an electromagnetic shielding function may be formed using a plating process, such that the metal wall may be directly connected to a printed circuit board.

For example, according to an aspect of the present disclosure, a component package includes a printed circuit board; a first electronic component disposed in a first region on the printed circuit board; a second electronic component disposed in a second region on the printed circuit board; and a metal wall disposed on the printed circuit board and spatially partitioning the first region and the second region on a plane. The metal wall is directly connected to the printed circuit board.

For example, according to an aspect of the present disclosure, a printed circuit board includes a substrate having a first surface and a second surface, opposing the first surface; a first wiring layer disposed on a first surface of the substrate; a first passivation layer disposed on the first surface of the substrate and covering at least a portion of the first wiring layer; and a metal wall disposed on the first passivation layer and spatially partitioning at least two regions on a plane. The first wiring layer has a metal pad, the first passivation layer has an opening exposing a portion of the metal pad, and the metal wall is disposed on the metal pad, is disposed the opening, and protrudes to a surface of the first passivation layer.

For example, according to an aspect of the present disclosure, a component package includes a substrate; a wiring layer including a metal pad extending from a first edge of the substrate to a second edge of the substrate; a passivation layer disposed on the substrate, and having an opening extending from the first edge of the substrate to the second edge of the substrate to expose the metal pad; a metal wall disposed in the opening of the passivation layer and protruding from a surface of the passivation layer, the metal wall extending from the one first edge of the substrate to the second edge of the substrate; and a first electronic component disposed on one side of the metal wall and a second electronic component disposed on another side of the metal wall.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
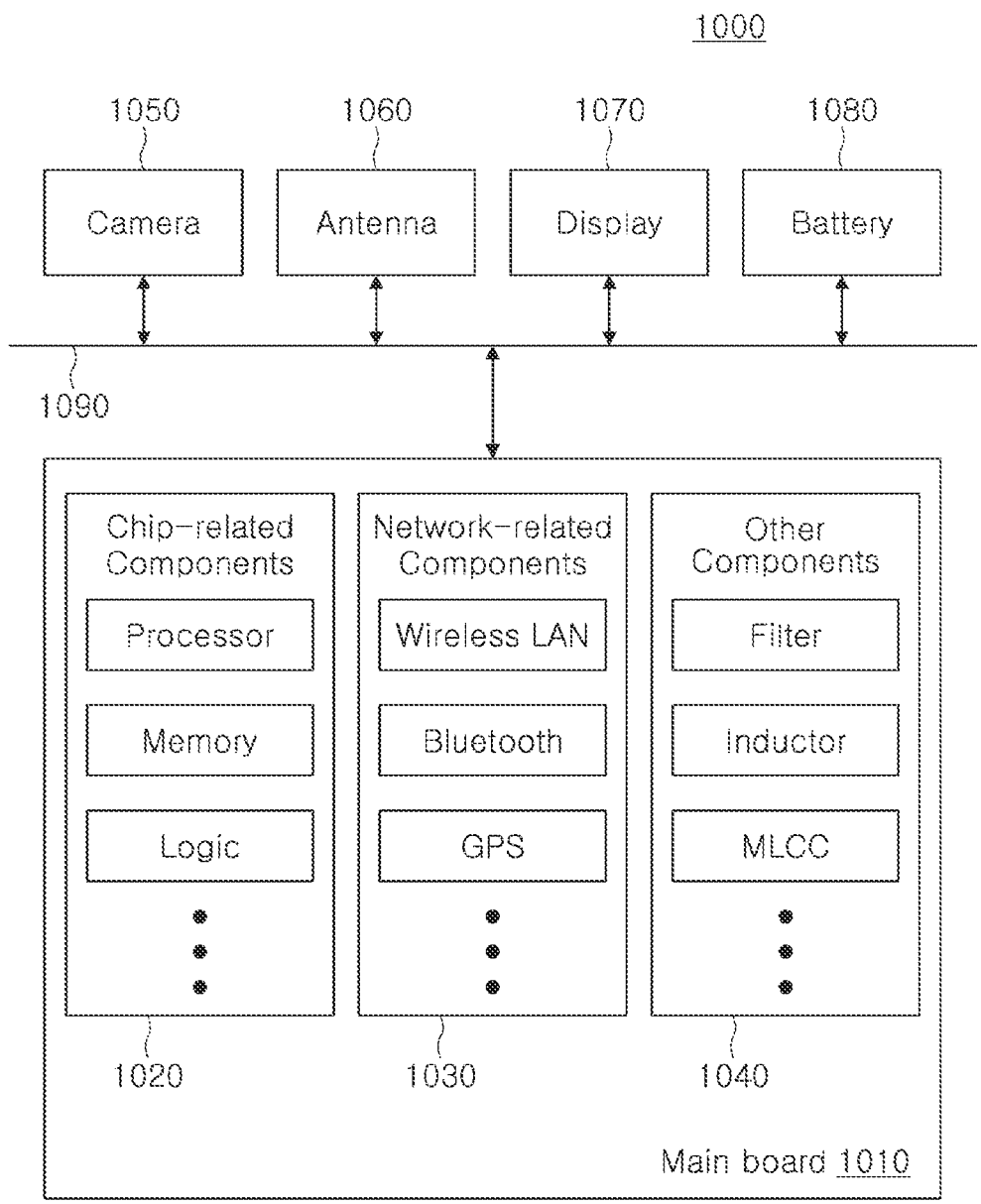
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
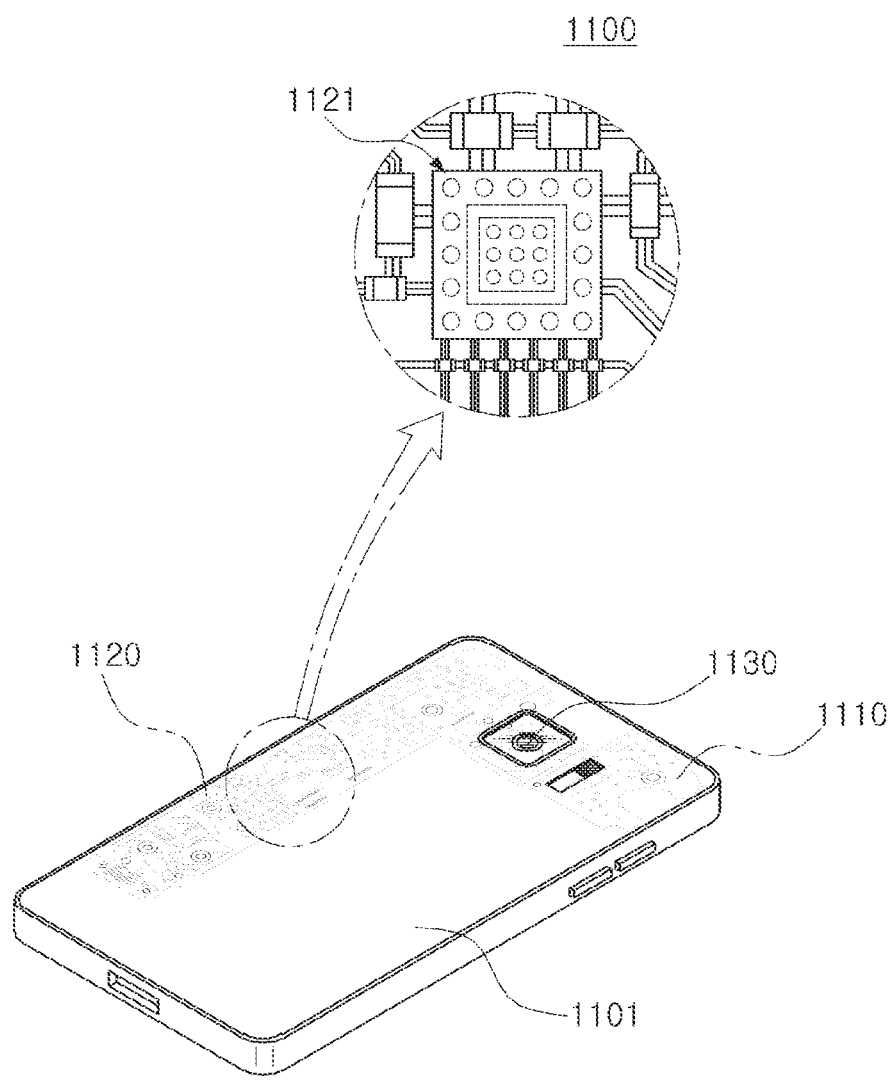
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker may be accommodated therein. Some of the components 1120 may be the chip related components, such as a component package 1121, for example, but an example embodiment thereof is not limited thereto. In the component package 1121, a plurality of electronic components may be disposed on a multilayer printed circuit board in the form of surface mounting, but an example embodiment thereof is not limited thereto. The electronic device is not necessarily limited to the smartphone 1100, and may be other electronic devices as described above.

Figure 3:
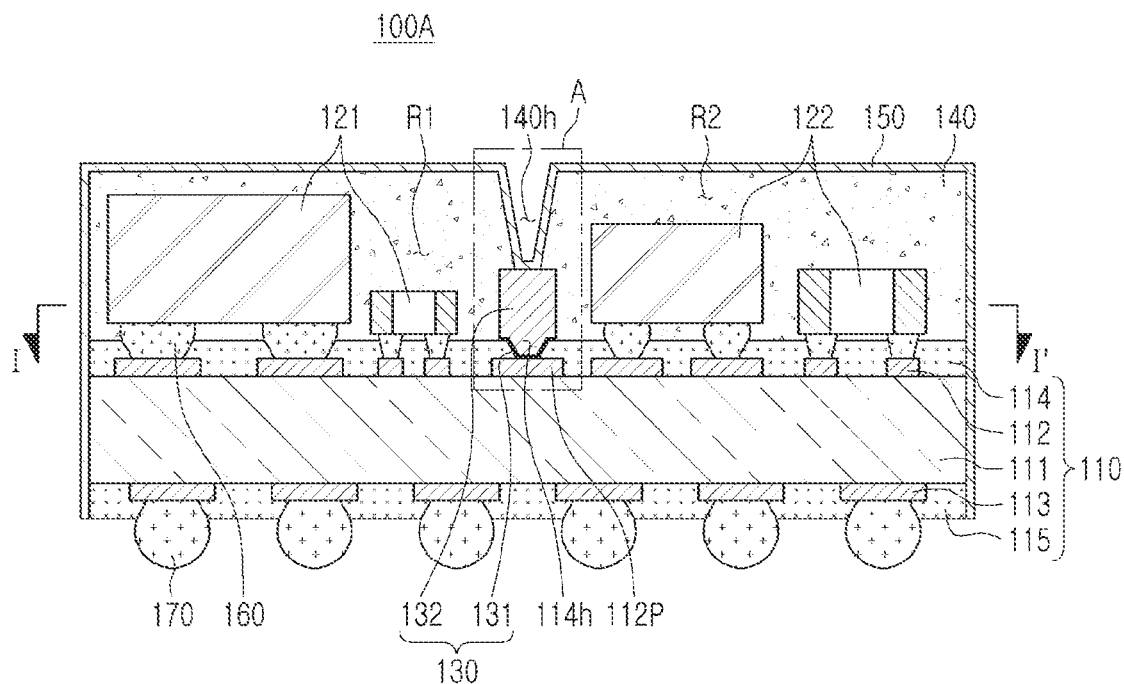
FIG. 3 is a cross-sectional diagram illustrating an example of a component package.

FIG. 3 is a cross-sectional diagram illustrating an example of a component package.

Figure 4:
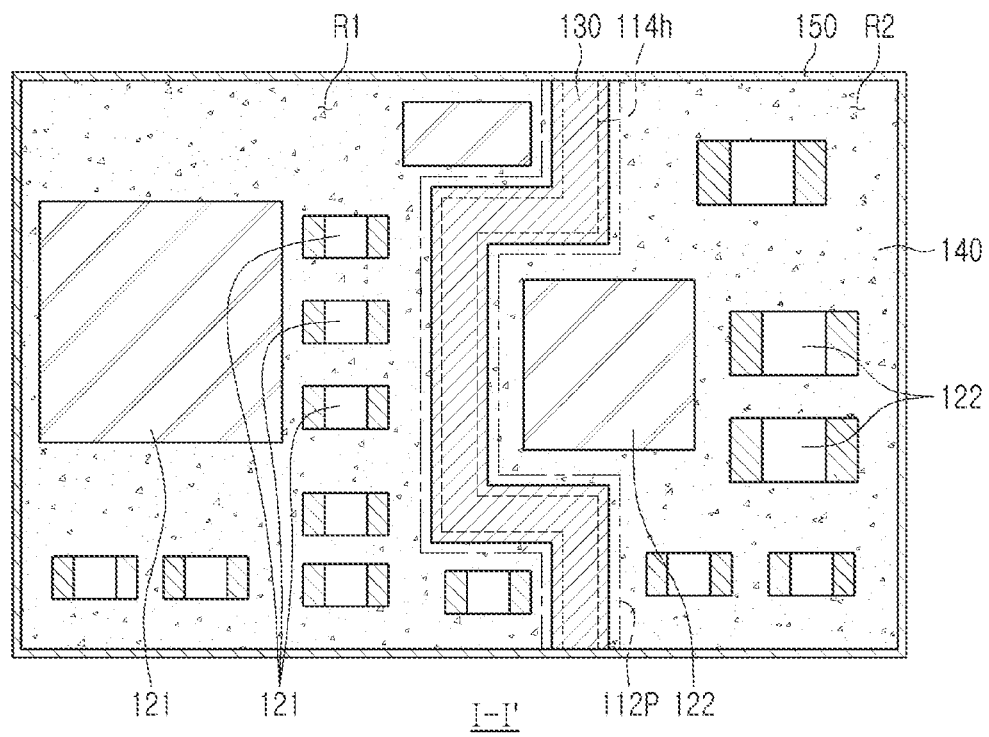
FIG. 4 is a plan cross-sectional diagram illustrating the component package illustrated in FIG. 3 taken along line I-I'.

FIG. 4 is a plan cross-sectional diagram illustrating the component package illustrated in FIG. 3 taken along line I-I'.

Referring to the diagrams, a component package 100A in the example embodiment may include a printed circuit board 110, a first electronic component 121 disposed in a first region R1 on the printed circuit board 110, a second electronic component 122 disposed in a second region R2 on the printed circuit board 110, and a metal wall 130 disposed on the printed circuit board 110 and configured to spatially partition the first region R1 and the second region R2. The metal wall 130 may cross between the first electronic component 121 and the second electronic component 122 and may be directly connected to the printed circuit board 110. For example, the printed circuit board 110 may include a substrate 111, a first wiring layer 112 disposed on an upper surface of the substrate 111 and including a metal pad 112P, and a first passivation layer 114 disposed on the upper surface of the substrate 111, covering at least a portion of the first wiring layer 112, and having an opening 114h exposing a portion of the metal pad 112P. The metal wall 130 may be disposed on the metal pad 112P, may fill the opening 114h and may protrude onto a surface of the first passivation layer 114.

In the component package 100A in the example embodiment, as a plurality of various types of components 121 and 122 may be disposed on the printed circuit board 110, the component package 100A may have a size reduced through modularization. For example, the component package 100A may be used as an integrated RF module. Also, as the metal wall 130 which may partition the regions R1 and R2 for each function is disposed on the printed circuit board 110, frequency interference between the components 121 and 122 may be effectively prevented through electromagnetic wave shielding. In particular, the metal wall 130 may be formed through a plating process so as to be directly connected to the printed circuit board 110. Therefore, the metal wall 130 may be continuously formed on a plane, and in this case, the metal wall 130 may entirely partition the first region R1 and the second region R2, thereby providing an excellent electromagnetic shielding effect. The configuration in which the metal wall 130 may be continuously formed may indicate that the metal wall 130 may have a length longer than at least a line width on a plane. Preferably, the configuration may indicate that the metal wall 130 may be continuously formed so as to entirely partition the first and second regions R1 and R2 without disconnection on a plane. If necessary, a partially disconnected region may be present in the metal wall 130, but even in this case, the disconnected region between the metal walls 130 may be smaller than the region of the metal wall 130. In one example, the plane may refer to a plane parallel to an upper surface of the printed circuit board 110. For example, the plane may refer to a plane parallel to an upper surface of the substrate 111 of the printed circuit board 110, or the plane may refer to a plane of the upper surface of the substrate 111 of the printed circuit board 110.

To continuously form the metal wall 130, the metal pad 112P may also be continuously formed on the upper surface of the substrate 111 on a plane, and the opening 114h may also continuously expose a portion of the metal pad 112P on a plane. The configuration in which the metal pad 112P and the opening 114h exposing the metal pad 112P may be continuously formed may indicate that each of the metal pad 112P and the opening 114h exposing the metal pad 112P may have a length at least longer than a line width on a plane. For example, in accordance with the continuous arrangement of the metal wall 130, the metal pad 112P and the opening 114h exposing the metal pad 112P may also be continuously formed to spatially entirely partition the first and second regions R1 and R2 on a plane. In this case, the metal wall 130 may be continuously formed easily.

The metal wall 130 may include a first conductive layer 131 continuously formed on an exposed surface of the metal pad 112P, a wall surface of the opening 114h, and a surface of the first passivation layer 114, and a second conductive layer 132 continuously formed on first conductive layer 131, continuously filling the opening 114h, and having a portion continuously protruding to the first passivation layer 114. Accordingly, the metal wall 130 may be continuously formed by a plating process, and may include the first conductive layer 131 that is a seed layer formed by electroless plating and the second conductive layer 132 that is a plating layer formed by electrolytic plating. In this case, the layers may be continuously formed in an effective manner.

If necessary, the component package 100A in the example embodiment may further include an encapsulant 140 disposed on the printed circuit board 110, covering at least a portion of each of the first and second electronic components 121 and 122, and having a groove portion 140h exposing a portion of the metal wall 130, and may further include a metal layer 150 covering an external surface of the encapsulant 140 and a side surface of the printed circuit board 110, and extending to the exposed surface of the metal wall 130 and the wall surface of the groove portion 140h. The groove portion 140h may continuously expose a portion of the metal wall 130 on a plane. The configuration in which the groove portions 140h are continuously formed indicates that each of the groove portions 140h may have a length at least longer than a line width on a plane. For example, in accordance with the continuous arrangement of the metal wall 130, the groove portion 140h and the metal layer 150 disposed therein may also be continuously formed to entirely partition the first and second regions R1 and R2 on the plane. In this case, a substantially complete shielding wall may be formed between the first region R1 and the second region R2 through the metal wall 130 and the metal layer 150.

If necessary, the component package 100A in the example embodiment may further include a plurality of first electrical connection metals 160 and a plurality of second electrical connection metals 170 disposed on the upper and lower sides of the printed circuit board 110, respectively. For example, the printed circuit board 110 may further include a second wiring layer 113 disposed on the lower surface of the substrate 111 and a second passivation layer disposed on the lower surface of the substrate 111 and covering at least a portion of the second wiring layer 113, and the first and second passivation layers 114 and 115 may have a plurality of first and second openings exposing at least portions of the first and second wiring layers 112 and 113, respectively. The plurality of first and second electrical connection metals 160 and 170 may be disposed on the plurality of first and second openings and may be connected to the exposed first and second wiring layers 112 and 113, respectively. The first and second electronic components 121 and 122 may be mounted on the printed circuit board 110 through the plurality of first electrical connection metals 160. The printed circuit board 110 may be mounted on an external substrate, such as a main board, or the like, for example, through the plurality of second electrical connection metals 170.

The component package 100A in the example embodiment may include a printed circuit board according to an example embodiment. The printed circuit board according to the example embodiment may include the printed circuit board 110 and also the printed circuit board 110 in which the metal wall 130 is formed. Accordingly, the printed circuit board in the example embodiment may include the printed circuit board 110 and the metal wall 130 described above. If necessary, the first and second electrical connection metals 160 and 170 may be further included. As described above, the printed circuit board in the example embodiment may be a printed circuit board before the first and second electronic components 121 and 122 are mounted in the component package 100A of the example embodiment.

In the description below, each of the elements included in the component package 100A according to an example embodiment will be described in greater detail with reference to the drawings.

The printed circuit board 110 may include the substrate 111, the first and second wiring layers 112 and 113 disposed on both surfaces of the substrate 111, and the first and second passivation layers 114 and 115 disposed on the both surfaces of the substrate 111 and covering at least portions of the first and second wiring layers 112 and 113, respectively. The substrate 111 may be configured as a core-type substrate in which an inner insulating body may have a core layer. Alternatively, the substrate 111 may be configured as a coreless-type substrate in which an internal insulating body only includes a built-up layer. A plurality of wiring layers may be disposed in the insulating body in the substrate 111. Also, a plurality of via layers for electrically connecting the wiring layers may be disposed.

An insulating material may be used for a material of an insulating layer included in the insulating body of the substrate 111. As the insulating material, a thermosetting resin such as epoxy resin or a thermoplastic resin such as polyimide, and the above-mentioned resin including inorganic fillers such as silica and/or reinforcing materials such as glass fibers may be used. For example, an insulating material of copper clad laminate (CCL), Ajinomoto build-up film (ABF), prepreg, etc., may be used, but an example embodiment thereof is not limited thereto.

As a material of a wiring layer disposed in the insulating body of the substrate 111, a metal material may be used, and as the metal material, copper (Cu), aluminum (Al), silver (Ag), Tin (Sn), gold (Au), nickel (Ni), lead (Pb), titanium (Ti), or an alloy thereof may be used. The wiring layers may perform various functions according to a design. For example, the wiring layers may include a ground pattern, a power pattern, a signal pattern, and the like. Each of these patterns may have a shape of line, a shape of plane, or a pad shape. The wiring layers may be formed by a plating process such as an additive process (AP), a semi-AP (SAP) process, a modified SAP (MSAP) process, a tenting (TT) process, or the like, and may thus include a seed layer, an electroless plating layer, and an electrolytic plating layer formed on the basis of the seed layer. When resin coated copper (RCC) or the like, is used as the material of the insulating layer, the wiring layer may further include a metal foil such as copper foil. If necessary, a primer resin may be present on the surface of the metal foil.

As a material of a via layer disposed in the insulating body of the substrate 111, a metal material may be used, and as the metal material, copper (Cu), aluminum (Al), silver (Ag), Tin (Sn), gold (Au), nickel (Ni), lead (Pb), titanium (Ti), or an alloy thereof may be used. The via layer may include a signal-use via, a ground-use via, a power-use via, and the like, according to a design. A via of the via layer may be completely filled with a metal material, or a metal material may be formed along a wall surface of the via hole. The via layer may have a tapered shape. The via layer may be formed by a plating process, such as AP, SAP, MSAP, TT, or the like, for example, along with the wiring layer, and may include an electroless plating layer, a seed layer, and an electroplating layer formed on the basis of the seed layer.

The first and second wiring layers 112 and 113 may be configured as an outermost wiring layer of the substrate 111. The first and second wiring layers 112 and 113 may be configured as protruding patterns with reference to the substrate 111, but an example embodiment thereof is not limited thereto, and the first and second wiring layers 112 and 113 may be configured as buried patterns which may be buried in the outermost side of the insulating body of the substrate 111 and exposed. As a material of the first and second wiring layers 112 and 113, a metal material may be used, and as the metal material, copper (Cu), aluminum (Al), silver (Ag), Tin (Sn), gold (Au), nickel (Ni), lead (Pb), titanium (Ti), or an alloy thereof may be used. The first and second wiring layers 112 and 113 may perform various functions according to a design. For example, the first and second wiring layers 112 and 113 may include a ground pattern, a power pattern, a signal pattern, and the like. Each of these patterns may have a shape of line, a shape of plane, or a pad shape. The first and second wiring layers 112 and 113 may be formed by a plating process, such as AP, SAP, MSAP, TT, or the like, for example, and may thus include an electroless plating layer, a seed layer, and an electroplating layer formed on the basis of the seed layer. The first and second wiring layers 112 and 113 may further include metal foil such as copper foil. If necessary, a primer resin may be present on the surface of the metal foil.

The first and second passivation layers 114 and 115 may protect internal components of the substrate 111 from external physical and chemical damages. The first and second passivation layers 114 and 115 may have a plurality of first and second openings, respectively. Each of the plurality of first openings may expose at least a portion of the first wiring layer 112. Each of the plurality of second openings may expose at least a portion of the second wiring layer 113. The material of the first and second passivation layers 114 and 115 may be an insulating material. As the insulating material, a thermosetting resin such as epoxy resin, a thermoplastic resin such as polyimide, or a mixture of these resins with an inorganic filler, such as ABF, may be used, but an example embodiment thereof is not limited thereto. Solder resist (SR) a photosensitive material may also be used.

Each of the first and second electronic components 121 and 122 may be an active component and/or a passive component. The active component may be configured as various types of integrated circuit (IC) dies in which hundreds to millions of devices are integrated into a single chip. A passive component may include a chip-type capacitor such as a multilayer ceramic capacitor (MLCC), and a chip-type inductor such as a power inductor (PI). However, an example embodiment thereof is not limited thereto, and other types of active components and/or passive components may also be disposed. A plurality of active components and/or a plurality of passive components may be disposed. These active components and/or passive components may be electrically connected to each other through the substrate 111 if necessary.

The metal wall 130 may be configured as a metal post having a predetermined length, and may spatially partition the first region R1 and the second region R2. The metal wall 130 may be continuously formed on a plane, and in this case, the metal wall 130 may entirely partition the first region R1 and the second region R2, thereby providing excellent electromagnetic shielding effect. A metal material may be used as the material of the metal wall 130, and as the metal material, copper (Cu), aluminum (Al), silver (Ag), tin (Sn), gold (Au), nickel (Ni), Lead (Pb), titanium (Ti), or an alloy thereof may be used. The metal wall 130 may be directly connected to the metal pad 112P, and may be electrically connected to an internal wiring of the substrate 111, a ground pattern, for example. The metal wall 130 may be disposed on the metal pad 112P, may fill the opening 114h, and may protrude onto the surface of the first passivation layer 114. For example, the metal wall 130 may include a first conductive layer 131 continuously formed on the exposed surface of the metal pad 112P, the wall surface of the opening 114h, and a portion of the surface of the first passivation layer 114, and a second conductive layer 132 continuously formed on the first conductive layer 131, continuously filling the opening 114h, and having a portion protruding onto the first passivation layer 114. A maximum line width of the protruding portion of the metal wall 130 on a cross sectional surface may be greater than a maximum line width of a portion of the metal wall 130 filling the opening 114h on a cross sectional surface.

The encapsulant 140 may be disposed on the first passivation layer 114 of the printed circuit board 110 and may cover at least a portion of each of the first and second electronic components 121 and 122 and the metal wall 130. The encapsulant 140 may have a groove portion 140h exposing a portion of the metal wall 130. The groove portion 140h may be formed in a trench shape having a predetermined length. An insulating material may be used as a material of the encapsulant 140, and as the insulating material, a thermosetting resin such as an epoxy resin or a thermoplastic resin such as polyimide, or those resins including inorganic fillers such as silica may be used. For example, an ABF may be used as the material of the encapsulant 140. However, an example embodiment thereof is not limited thereto, and other types of epoxy molding compound (EMC) may be used, or a photosensitive material such as a photoimageable dielectric (PID) may be used.

The metal layer 150 may perform electromagnetic wave shielding and heat dissipation functions. The metal layer 150 may cover an external surface of the encapsulant 140 and a side surface of the printed circuit board 110, and may cover a wall surface of the groove portion 140h and an exposed surface of the metal wall 130. The metal layer 150 may be directly connected to the metal wall 130. A substantially complete shielding wall may be formed between the first region R1 and the second region R2 through the metal layer 150 and the metal wall 130. A metal material may be used as the material of the metal layer 150, and as the metal material, copper (Cu), aluminum (Al), silver (Ag), tin (Sn), gold (Au), nickel (Ni), and lead (Pb), titanium (Ti), or an alloy thereof may be used. The metal layer 150 may be formed by sputtering, or the like.

The first and second electrical connection metals 160 and 170 may be disposed on the first and second openings of the first and second passivation layers 114 and 115, respectively. The first and second electrical connection metals 160 and 170 may be electrically connected to the exposed first and second wiring layers 112 and 113, respectively. The first electrical connection metal 160 may electrically connect the first and second electronic components 121 and 122 to the first wiring layer 112. The second electrical connection metal 170 may physically and/or electrically connect the component package 100A to an external entity. For example, the component package 100A may be mounted on a main board of an electronic device through the above configuration. The first and second electrical connection metals 160 and 170 may be formed of tin (Sn) or an alloy including tin (Sn), such as solder, for example, but an example embodiment thereof not limited thereto. Each of the first and second electrical connection metals 160 and 170 may be configured as a land, a ball, a pin, or the like.

Figure 5A:
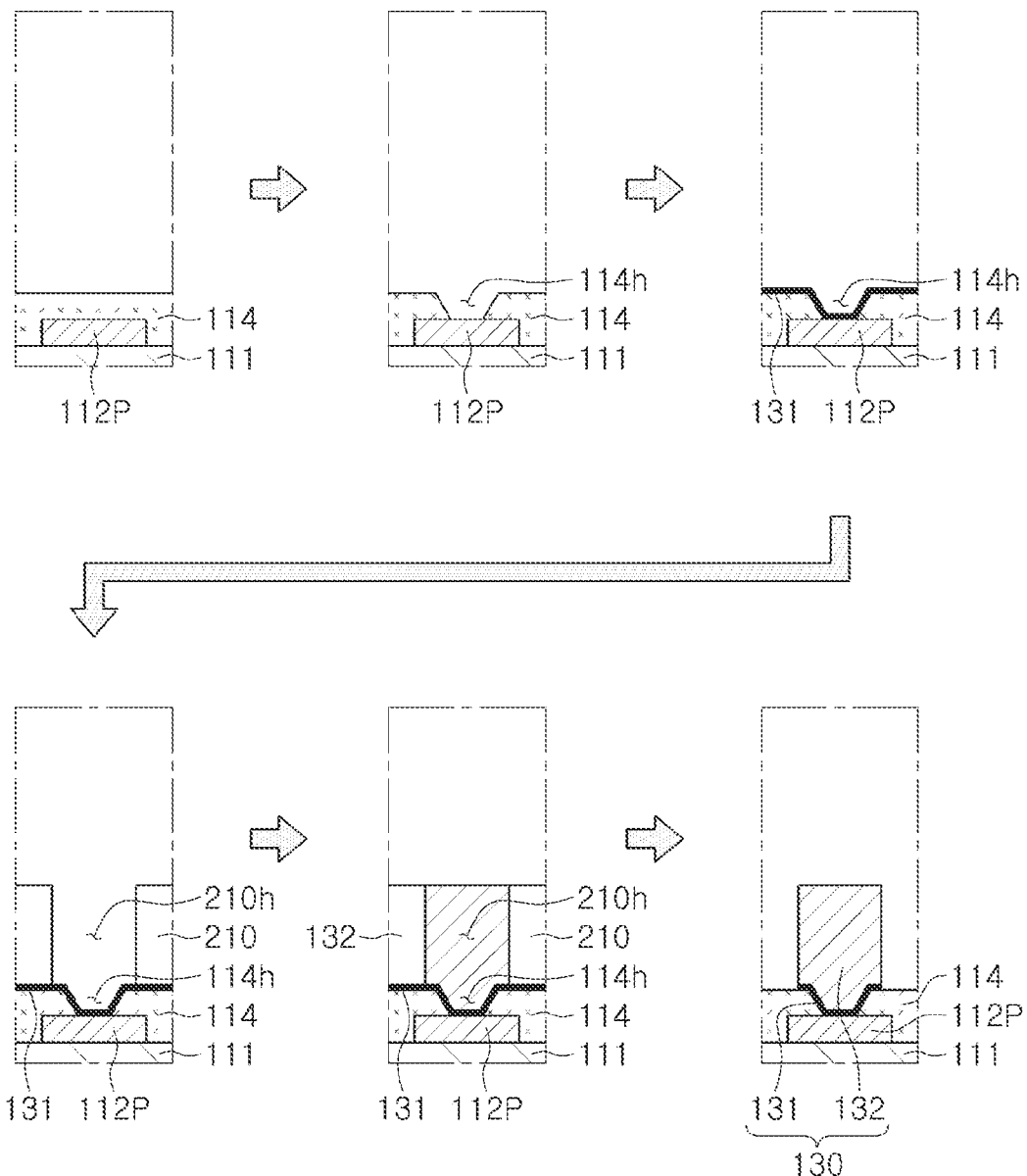
FIGS. 5A and 5B are cross-sectional diagrams illustrating an example of processes of forming region A of the component package illustrated in FIG. 3.
Figure 5B:
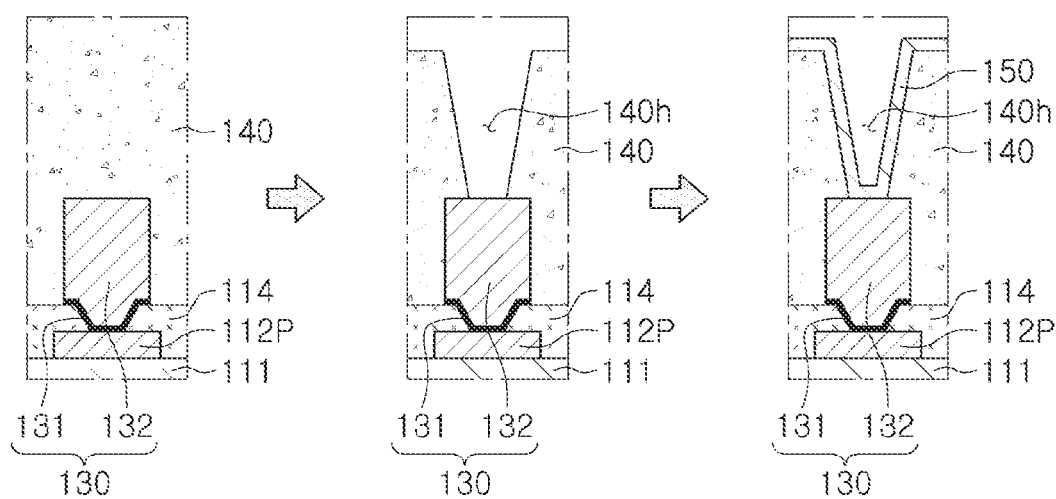

FIGS. 5A and 5B are cross-sectional diagrams illustrating an example of processes of forming region A of the component package illustrated in FIG. 3.

Referring to FIG. 5A, an opening 114h exposing a portion of a metal pad 112P may be formed in a first passivation layer 114 by a photolithography process. The opening 114h may be formed to continuously expose a portion of the metal pad 112P on a plane. Thereafter, the first conductive layer 131, a seed layer, may be formed by electroless plating. A patterned dry film 210 may be formed on the first conductive layer 131 to have a pattern groove 210h. The pattern groove 210h may be formed to continuously expose the opening 114h on a plane. Thereafter, the second conductive layer 132 may be formed by filling the opening 114h and the pattern groove 210h on the first conductive layer 131 by electroplating. The metal wall 130 may be formed through a series of the processes. Thereafter, the dry film 210 may be removed.

Referring to FIG. 5B, a groove portion 140h exposing a portion of the metal wall 130 may be formed in the encapsulant 140 by a laser process. The groove portion 140h may be formed to continuously expose a portion of the surface of the metal wall 130 on a plane. Thereafter, a metal layer 150 covering an external surface of the encapsulant 140, a wall surface of the groove portion 140h and a portion of the surface of the exposed metal wall 130 may be formed by a sputtering process. Region A may be formed through a series of the processes. As the descriptions of the other configurations may be the same as above, the detailed descriptions thereof will not be repeated.

Figure 6:
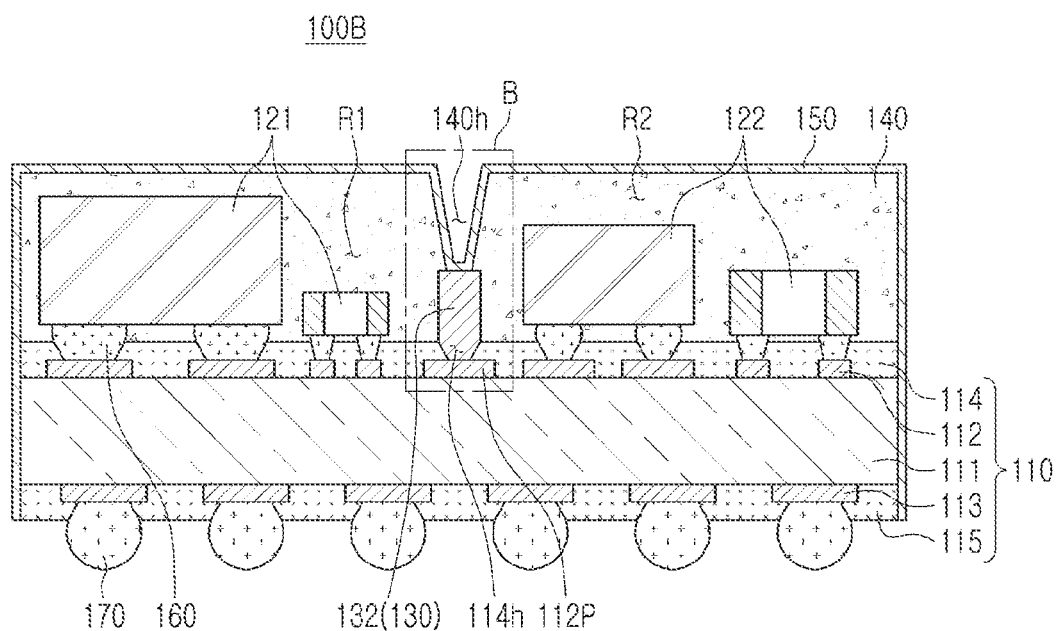
FIG. 6 is a cross-sectional diagram illustrating another example of a component package.

FIG. 6 is a cross-sectional diagram illustrating another example of a component package.

Referring to the diagrams, in a component package 100B in the another example embodiment, a maximum line width of the protruding portion of the metal wall 130 on a cross-sectional surface may be the same as a maximum line width of the portion of the metal wall 130 filling the opening 114h a cross-sectional surface, differently from the component package 100A in the aforementioned example embodiment. The configuration in which the line widths may be the same may include the configurations in which the line widths are completely or roughly the same. Also, the metal wall 130 may include a second conductive layer 132, a plating layer, without the first conductive layer 131, a seed layer. Accordingly, a width of the metal wall 130 may be reduced in advance according to the open region of the metal wall 130 formed by the depth of the groove portion 140h formed in the encapsulant 140, such that flexibility in design for miniaturization may improve.

The component package 100B in another example embodiment may include a printed circuit board according to another example embodiment. In this case, the printed circuit board according to another example embodiment may include the printed circuit board 110 described above, as well as the printed circuit board 110 in which the modified metal wall 130 is formed. In other words, the printed circuit board according to another example embodiment may include the printed circuit board 110 and the modified metal wall 130 described above. If necessary, the first and second electrical connection metals 160 and 170 may be further included. As described above, the printed circuit board in another example embodiment may be a printed circuit board before the first and second electronic components 121 and 122 are mounted in the component package 100B of the example embodiment.

As the descriptions of the other configurations may be the same as above, the detailed descriptions thereof will not be repeated.

Figure 7A:
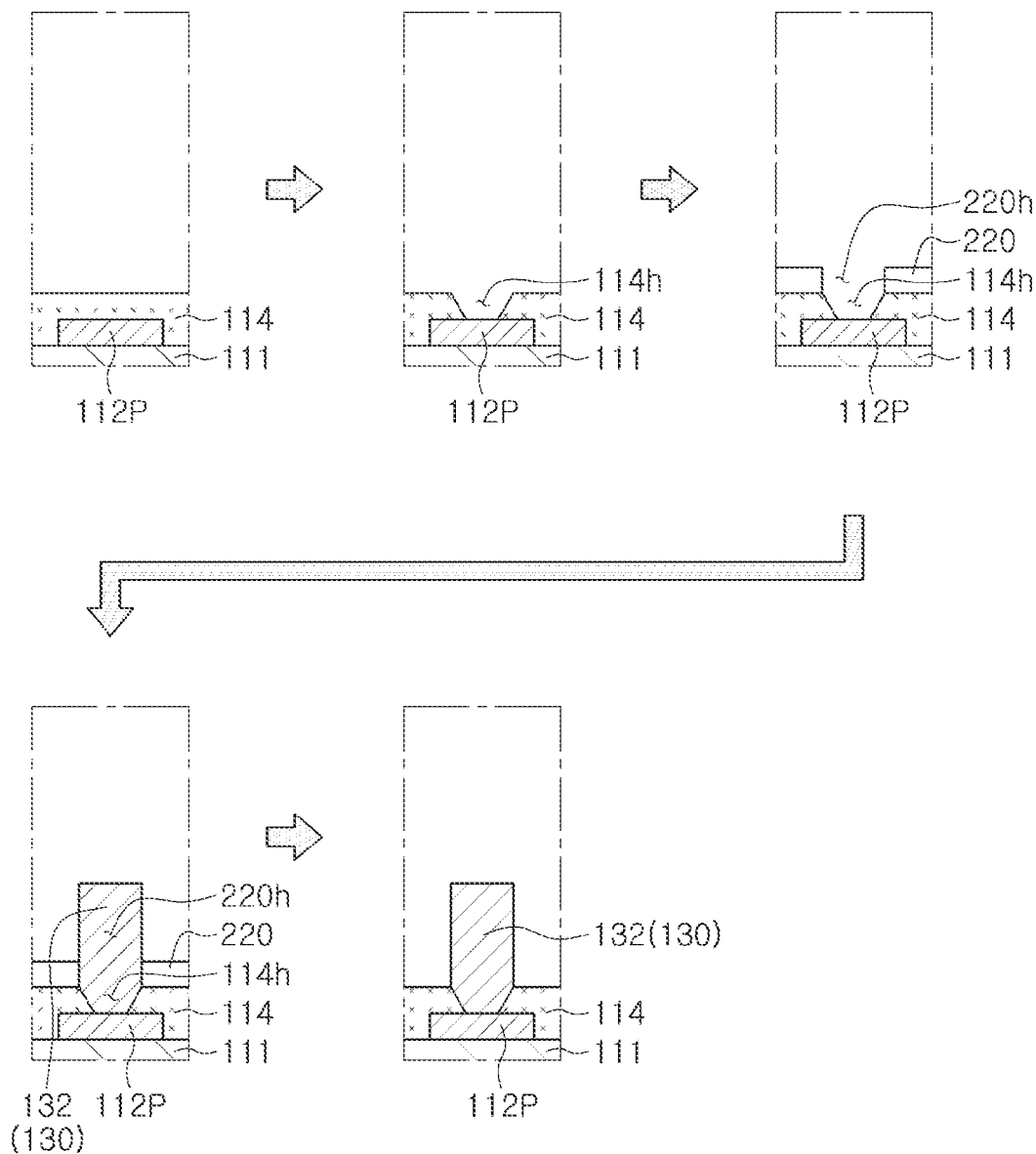
FIGS. 7A and 7B are cross-sectional diagrams illustrating an example of processes of forming region B of the component package illustrated in FIG. 6.
Figure 7B:
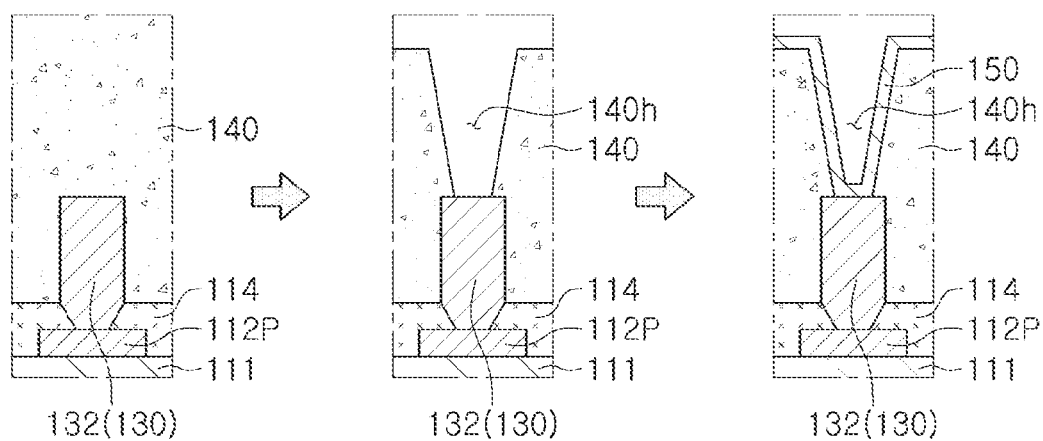

FIGS. 7A and 7B are cross-sectional diagrams illustrating an example of processes of forming region B of the component package illustrated in FIG. 6.

Referring to FIG. 7A, an opening 114h exposing a portion of the metal pad 112P may be formed in the first passivation layer 114 by a photolithography process. The opening 114h may be formed to continuously expose a portion of the metal pad 112P on a plane. Thereafter, a patterned dry film 220 may be formed on the first passivation layer 114 to have a pattern groove 220h without forming a seed layer. The pattern groove 220h may be formed to continuously expose the opening 114h on a plane. A width of the pattern groove 220h may be substantially the same as a width of the uppermost side of the opening 114h. A height of the dry film 220 may be relatively smaller than a height of the metal wall 130. In this case, since the contact region between the dry film 220 and the metal wall 130 is relatively small, the seed layer may not be provided. Thereafter, the second conductive layer 132 may be formed by filling the opening 114h and the pattern groove 220h on the metal pad 112P by electroplating. The metal wall 130 may be formed through a series of the processes. Thereafter, the dry film 220 may be removed.

Referring to FIG. 7B, a groove portion 140h exposing a portion of the metal wall 130 may be formed in the encapsulant 140 by a laser process. The groove portion 140h may be formed to continuously expose a portion of the surface of the metal wall 130 on a plane. Thereafter, a metal layer 150 covering an external surface of the encapsulant 140, a wall surface of the groove portion 140h and a portion of the surface of the exposed metal wall 130 may be formed by a sputtering process. Region B may be formed through a series of the processes. As the descriptions of the other configurations may be the same as above, the detailed descriptions thereof will not be repeated.

Figure 8:
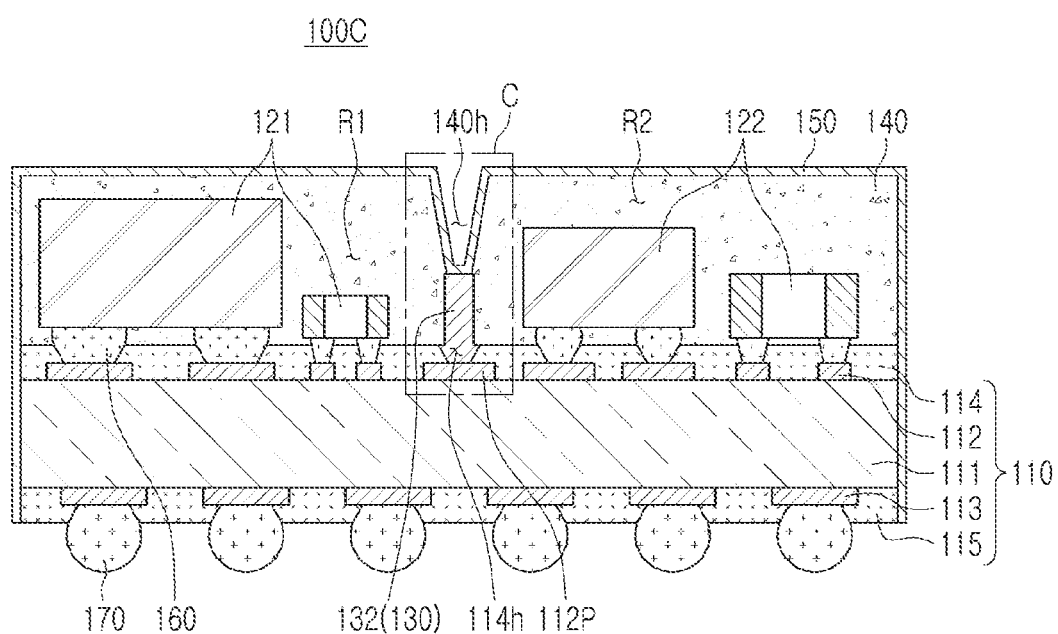
FIG. 8 is a cross-sectional diagram illustrating another example of a component package.

FIG. 8 is a cross-sectional diagram illustrating another example of a component package.

Referring to the diagram, in a component package 100C in another example embodiment, a maximum line width of the protruding portion of the metal wall 130 on a cross-sectional surface may be less than a maximum line width of the portion of the metal wall 130 filling the opening 114h a cross-sectional surface, differently from the component package 100A in the aforementioned example embodiment. Also, the metal wall 130 may include a second conductive layer 132, a plating layer, without the first conductive layer 131, a seed layer. Accordingly, a width of the metal wall 130 may be reduced in advance according to the open region of the metal wall 130 formed by the depth of the groove portion 140h formed in the encapsulant 140, such that flexibility in design for miniaturization may improve.

The component package 100C in another example embodiment may include a printed circuit board according to another example embodiment. In this case, the printed circuit board according to another example embodiment may include the printed circuit board 110 described above, as well as the printed circuit board 110 in which the modified metal wall 130 is formed. In other words, the printed circuit board according to another example embodiment may include the printed circuit board 110 and the modified metal wall 130 described above. If necessary, the first and second electrical connection metals 160 and 170 may be further included. As described above, the printed circuit board according to another example embodiment may be a printed circuit board before the first and second electronic components 121 and 122 are mounted in the component package 100C of the example embodiment.

As the descriptions of the other configurations may be the same as above, the detailed descriptions thereof will not be repeated.

Figure 9A:
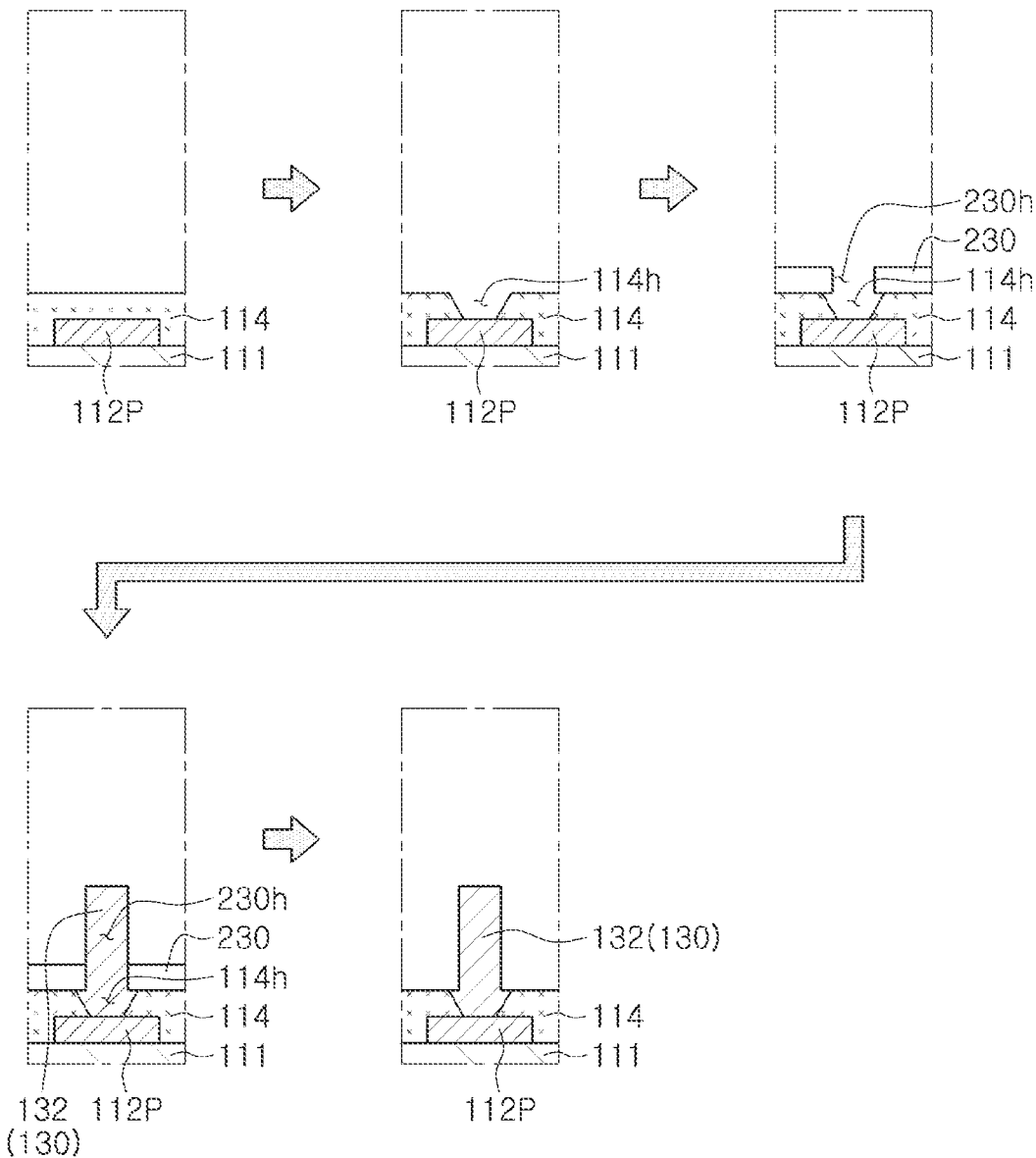
FIGS. 9A and 9B are cross-sectional diagrams illustrating an example of processes of forming region C of the component package illustrated in FIG. 8.
Figure 9B:
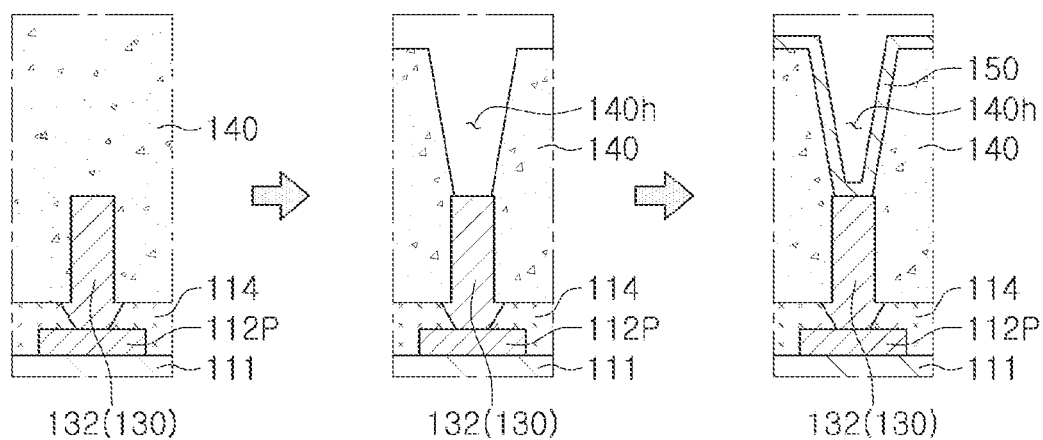

FIGS. 9A and 9B are cross-sectional diagrams illustrating an example of processes of forming region C of the component package illustrated in FIG. 8.

Referring to FIG. 9A, an opening 114h exposing a portion of the metal pad 112P may be formed in the first passivation layer 114 by a photolithography process. The opening 114h may be formed to continuously expose a portion of the metal pad 112P on a plane. Thereafter, a patterned dry film 230 may be formed to have a pattern groove 230h on the first passivation layer 114 without forming a seed layer. The pattern groove 230h may be formed to continuously expose the opening 114h on a plane. A width of the pattern groove 230h may be smaller than a width of the uppermost side of the opening 114h. A height of the dry film 230 may be relatively smaller than a height of the metal wall 130. In this case, since the contact region between the dry film 230 and the metal wall 130 is relatively small, the seed layer may not be provided. Thereafter, the second conductive layer 132 may be formed by filling the opening 114h and the pattern groove 230h on the metal pad 112P by electroplating. The metal wall 130 may be formed through a series of the processes. Thereafter, the dry film 230 may be removed.

Referring to FIG. 9B, thereafter, a groove portion 140h exposing a portion of the metal wall 130 may be formed in the encapsulant 140 by a laser process. The groove portion 140h may be formed to continuously expose a portion of the surface of the metal wall 130 on a plane. Thereafter, a metal layer 150 covering an external surface of the encapsulant 140, a wall surface of the groove portion 140h and a portion of the surface of the exposed metal wall 130 may be formed by a sputtering process, or the like. Region C may be formed through a series of the processes. As the descriptions of the other configurations may be the same as above, the detailed descriptions thereof will not be repeated.

Figure 10:
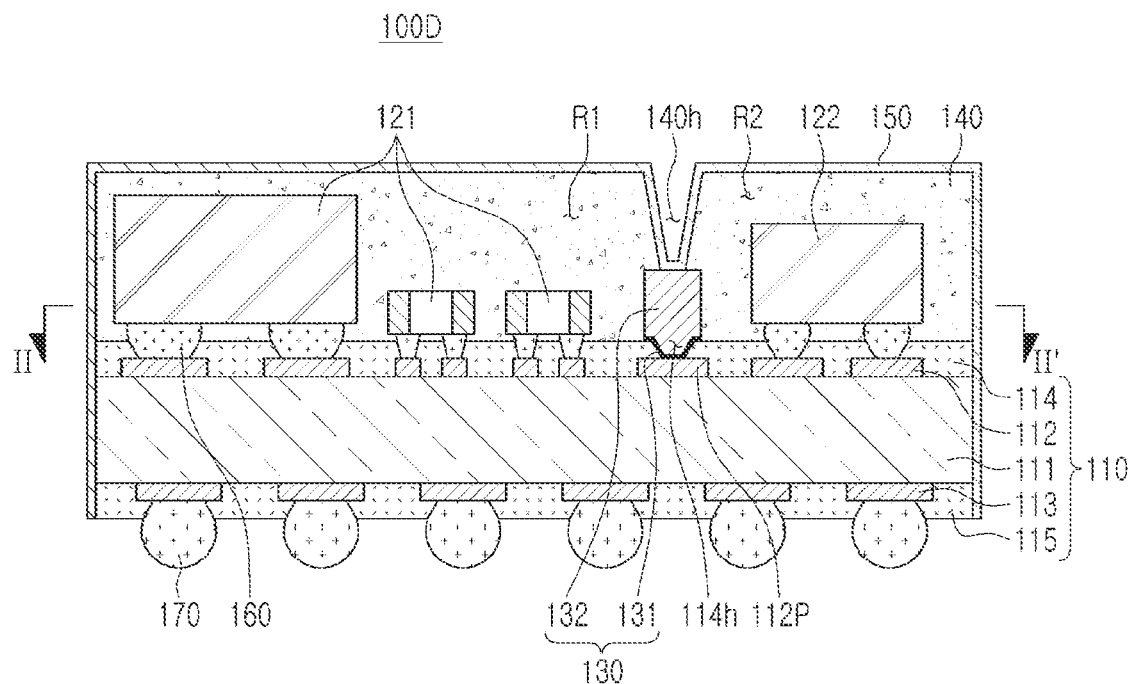
FIG. 10 is a cross-sectional diagram illustrating another example of a component package.

FIG. 10 is a cross-sectional diagram illustrating another example of a component package.

Figure 11:
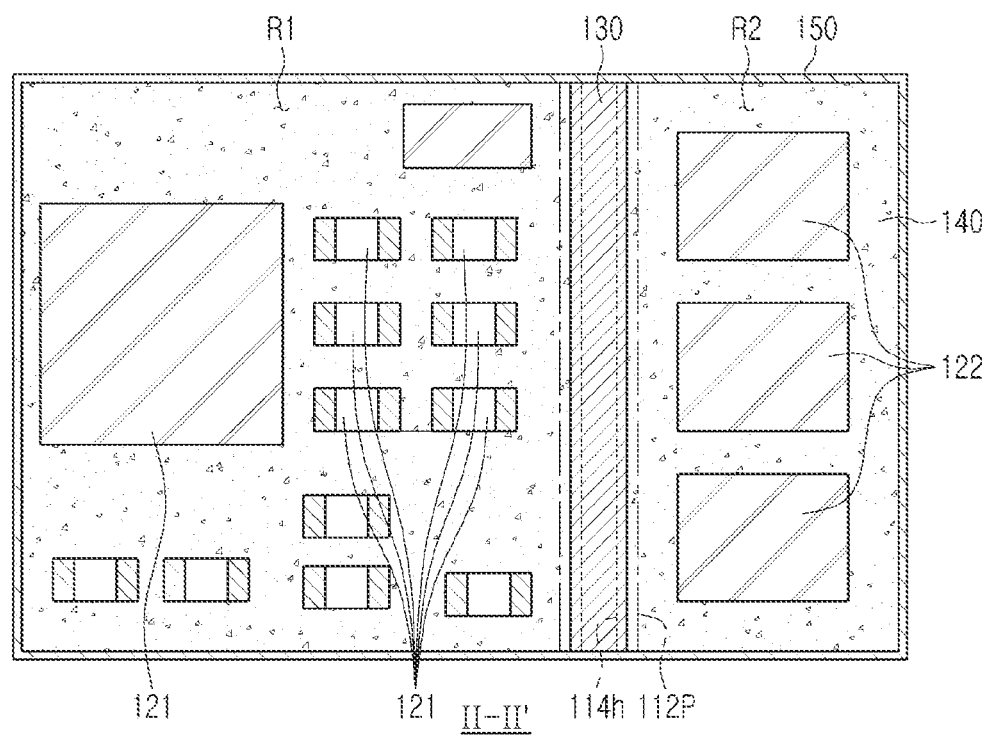
FIG. 11 is a plan cross-sectional diagram illustrating the component package illustrated in FIG. 10 taken along line II-II'.

FIG. 11 is a plan cross-sectional diagram illustrating the component package illustrated in FIG. 10 taken along line II-II'.

Referring to the drawings, in a component package 100D in another example embodiment, the active component and the passive component may be disposed together in the first region R1 similarly to the component package 100A, whereas only the passive component may be disposed in the second region R2. Accordingly, the pad pattern of the first wiring layer 112 of the printed circuit board 110 may also be modified. Accordingly, the second electronic component 122 disposed in the second region R2 may only include one or more active components. In this case, the metal wall 130 does not work as a barrier during the mounting process of the passive component, thereby improving mounting efficiency. The shape of the metal wall 130 of the component packages 100B and 100C of the aforementioned example embodiment may be introduced along with the above arrangement.

A component package 100D in another example embodiment may include a printed circuit board according to another example embodiment. In this case, the printed circuit board according to another example embodiment may include the printed circuit board 110 described above, as well as the printed circuit board 110 in which the modified metal wall 130 is formed. In other words, the printed circuit board according to another example embodiment may include the printed circuit board 110 and the modified metal wall 130 described above. If necessary, the first and second electrical connection metals 160 and 170 may be further included. As described above, the printed circuit board according to another example embodiment may be a printed circuit board before the first and second electronic components 121 and 122 are mounted in the component package 100D of the example embodiment.

As the descriptions of the other configurations may be the same as above, the detailed descriptions thereof will not be repeated.

According to the aforementioned example embodiments, a component package which may have a reduced size through modularization and a printed circuit board used for the same may be provided.

Also, a component package which may have an improved electromagnetic shielding function and a printed circuit board used for the same may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

While the example embodiments have been shown and described above, it will be apparent to those skilled in the art that modifications and variations could be made without departing from the scope of the present invention as defined by the appended claims.

What is claimed is:

1. A component package, comprising:
   a printed circuit board including a wiring layer having a metal pad and a passivation layer having an opening exposing a portion of the metal pad;
   a first electronic component disposed in a first region on the printed circuit board;
   a second electronic component disposed in a second region on the printed circuit board; and
   a metal wall disposed on the printed circuit board and spatially partitioning the first region and the second region on a plane,
   wherein the metal wall includes a seed layer directly connected to the printed circuit board and a plating layer extending from the seed layer,
   the metal wall includes a lower portion embedded in the printed circuit board and an upper portion protruding from the lower portion,
   an inclined angle of a side surface of the lower portion with respect to the plane is less than an inclined angle of a side surface of the upper portion with respect to the plane,
   the seed layer covers a wall surface of the opening of the passivation layer and a surface of the metal pad exposed through the opening of the passivation layer, and include a portion extending an upper surface of the passivation layer, and
   the plating layer is disposed on the seed layer to fill the opening while being spaced apart from the wall surface of the opening, and protrudes from the portion of the seed layer which extends on the upper surface of the passivation layer.

2. The component package of claim 1, wherein the metal wall extends continuously on the plane.

3. The component package of claim 1, further comprising:
   an encapsulant disposed on the printed circuit board and covering at least a portion of each of the first electronic component, the second electronic component, and the metal wall,
   wherein the encapsulant has a groove portion exposing a portion of the metal wall.

4. The component package of claim 1, wherein each of the first and second electronic components includes at least one of one or more active components and one or more passive components.

5. The component package of claim 1, wherein the first electronic component includes one or more active components and one or more passive components, and the second electronic component only includes one or more active components.

6. The component package of claim 1, wherein the metal wall extends continuously from a first edge of the printed circuit board to a second edge of the printed circuit board.

7. The component package of claim 3, wherein the groove portion continuously exposes a portion of the metal wall on a plane.

8. The component package of claim 7, further comprising:
   a metal layer covering an external surface of the encapsulant and a side surface of the printed circuit board and extending to an exposed surface of the metal wall and a wall surface of the groove portion.

9. A printed circuit board, comprising:
   a substrate having a first surface and a second surface, opposing the first surface;
   a first wiring layer disposed on the first surface of the substrate;
   a second wiring layer disposed on the second surface of the substrate;
   a first passivation layer disposed on the first surface of the substrate and covering at least a portion of the first wiring layer;
   a second passivation layer disposed on the second surface of the substrate and covering at least a portion of the second wiring layer;
   a metal wall disposed on the first passivation layer and spatially partitioning at least two regions on a plane;
   an encapsulant disposed on the first passivation layer and having a groove portion exposing a portion of the metal wall; and
   a metal layer disposed on the encapsulant and extending to the metal wall,
   wherein the first wiring layer has a metal pad,
   the first passivation layer has an opening exposing a portion of the metal pad,
   the metal wall includes a lower portion disposed on the metal pad and in the opening of the first passivation layer, and an upper portion protruding from the lower portion of the metal wall, the lower portion of the metal wall and the upper portion of the metal wall being flush with an upper surface of the first passivation layer,
   the first and second passivation layers have a plurality of first and second openings exposing at least portions of the first and second wiring layers, respectively,
   a plurality of first and second electrical connection metals are disposed on the plurality of first and second openings and are connected to the exposed first and second wiring layers, respectively,
   in a region where the metal wall is in contact with the metal layer, a line width of the metal wall is greater than a line width of metal layer, and
   on the upper surface of the first passivation layer, a line width of the upper portion of the metal wall of the first passivation layer is less than a line width of the lower portion of the metal wall.

10. The printed circuit board of claim 9, wherein the metal pad continuously extends on the first surface of the substrate.

11. The printed circuit board of claim 9, wherein a maximum line width of the upper portion of the metal wall on a cross-sectional surface is less than a maximum line width of the lower of the metal wall disposed in the opening on the cross-sectional surface.

12. The component package of claim 9, wherein the metal wall extends continuously from a first edge of the printed circuit board to a second edge of the printed circuit board.

13. The printed circuit board of claim 10, wherein the opening continuously exposes the portion of the metal pad on the plane.

14. The printed circuit board of claim 13, wherein the metal wall includes a first conductive layer continuously extending on an exposed surface of the metal pad, a wall surface of the opening, and a portion of a surface of the first passivation layer, and a second conductive layer continuously extending on the first conductive layer, continuously filling the opening, and having a portion continuously protruding to the first passivation layer.

15. A component package, comprising:
- a substrate;
- a wiring layer including a metal pad extending from a first edge of the substrate to a second edge of the substrate;
- a passivation layer disposed on the substrate, and having an opening extending from the first edge of the substrate to the second edge of the substrate to expose the metal pad;
- a metal wall including a lower portion disposed in the opening of the passivation layer and an upper portion protruding from the lower portion to the passivation layer, the metal wall extending from the first edge of the substrate to the second edge of the substrate;
- a first electronic component disposed on one side of the metal wall and a second electronic component disposed on another side of the metal wall; and
- an encapsulant disposed on the passivation layer and encapsulating the first electronic component and the second electronic component, the encapsulant having a groove portion exposing a portion of the metal wall; and
- a metal layer covering an external surface of the encapsulant and a side surface of the substrate, and extending to the metal wall,
- wherein an inclined angle of a side surface of the lower portion with respect to the plane is less than an inclined angle of a side surface of the upper portion with respect to the plane,
- the lower portion of the metal wall and the upper portion of the metal wall are flush with an upper surface of the passivation layer, and
- on the upper surface of the passivation layer, a line width of the upper portion of the metal wall of the passivation layer is less than a line width of the lower portion of the metal wall.

16. The component package of claim 15, wherein the metal layer covers an entirety of the side surface of the substrate.

* * * * *